US008750045B2

(12) United States Patent
Huang et al.

(10) Patent No.: US 8,750,045 B2
(45) Date of Patent: Jun. 10, 2014

(54) EXPERIENCE COUNT DEPENDENT PROGRAM ALGORITHM FOR FLASH MEMORY

(75) Inventors: Jianmin Huang, San Carlos, CA (US); Kulachet Tanpairoj, Santa Clara, CA (US); Chris Nga Yee Avila, Saratoga, CA (US); Gautam Ashok Dusija, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 112 days.

(21) Appl. No.: 13/560,896

(22) Filed: Jul. 27, 2012

(65) Prior Publication Data

US 2014/0029342 A1    Jan. 30, 2014

(51) Int. Cl.
*G11C 16/06* (2006.01)
*G11C 16/10* (2006.01)

(52) U.S. Cl.
CPC .................................. *G11C 16/10* (2013.01)
USPC ............ 365/185.12; 365/185.22; 365/185.19; 365/185.29; 365/185.14; 365/189.04

(58) Field of Classification Search
CPC .. G11C 16/16; G11C 16/344; G11C 16/3445; G11C 16/06; G11C 16/10; G11C 16/3436
USPC ............. 365/185.22, 185.19, 185.29, 185.11, 365/185.14, 185.33, 189.04
See application file for complete search history.

(56) References Cited

U.S. PATENT DOCUMENTS

| | | | |
|---|---|---|---|
| 5,043,940 A | 8/1991 | Harari | |
| 5,070,032 A | 12/1991 | Yuan et al. | |
| 5,095,344 A | 3/1992 | Harari | |
| 5,172,338 A | 12/1992 | Mehrotra et al. | |
| 5,268,870 A | 12/1993 | Harari | |
| 5,289,401 A | 2/1994 | Shima | |
| 5,313,421 A | 5/1994 | Guterman et al. | |
| 5,315,541 A | 5/1994 | Harari et al. | |
| 5,341,339 A | 8/1994 | Wells | |
| 5,343,063 A | 8/1994 | Yuan et al. | |
| 5,388,083 A | 2/1995 | Assar et al. | |

(Continued)

FOREIGN PATENT DOCUMENTS

| | | |
|---|---|---|
| EP | 0 913 832 A1 | 5/1999 |
| WO | WO2004/040459 A1 | 5/2004 |
| WO | WO2004/040578 A2 | 5/2004 |
| WO | WO2004/040585 A1 | 5/2004 |

OTHER PUBLICATIONS

"3.1: Objects, values and types." Python Library Reference. 2004, 2 pages. http://web.archive.org/web/20040823015823/docs.python.org/ref/about.html.

(Continued)

*Primary Examiner* — Thong Q Le
(74) *Attorney, Agent, or Firm* — Davis Wright Tremaine LLP

(57) ABSTRACT

In a non-volatile memory device, the parameters used in write and erase operation are varied based upon device age. For example, in a programming operation using a staircase waveform, the amplitude of the initial pulse can be adjusted based upon the number of erase-program cycles (hot count) of the block containing the selected physical page for the write. This arrangement can preserve performance for relatively fresh devices, while extending life as a devices ages by using gentler waveforms as the device ages.

10 Claims, 13 Drawing Sheets

(56) References Cited

U.S. PATENT DOCUMENTS

| | | | |
|---|---|---|---|
| 5,479,633 A | 12/1995 | Wells et al. |
| 5,479,638 A | 12/1995 | Assar et al. |
| 5,485,595 A | 1/1996 | Assar et al. |
| 5,530,828 A | 6/1996 | Kaki et al. |
| 5,532,962 A | 7/1996 | Auclair et al. |
| 5,570,315 A | 10/1996 | Tanaka et al. |
| 5,595,924 A | 1/1997 | Yuan et al. |
| 5,640,529 A | 6/1997 | Hasbun |
| 5,644,539 A | 7/1997 | Yamagami et al. |
| 5,661,053 A | 8/1997 | Yuan |
| 5,701,266 A | 12/1997 | Fazio et al. |
| 5,729,489 A | 3/1998 | Fazio et al. |
| 5,768,192 A | 6/1998 | Eitan |
| 5,774,397 A | 6/1998 | Endoh et al. |
| 5,798,968 A | 8/1998 | Lee et al. |
| 5,890,192 A | 3/1999 | Lee et al. |
| 5,903,495 A | 5/1999 | Takeuchi et al. |
| 5,909,449 A | 6/1999 | So et al. |
| 5,930,167 A | 7/1999 | Lee et al. |
| 5,956,743 A | 9/1999 | Bruce et al. |
| 6,000,006 A | 12/1999 | Bruce et al. |
| 6,011,725 A | 1/2000 | Eitan |
| 6,046,935 A | 4/2000 | Takeuchi et al. |
| 6,222,762 B1 | 4/2001 | Guterman et al. |
| 6,230,233 B1 | 5/2001 | Lofgren et al. |
| 6,233,644 B1 | 5/2001 | Dahlen et al. |
| 6,286,016 B1 | 9/2001 | Heller et al. |
| 6,345,001 B1 | 2/2002 | Mokhlesi |
| 6,373,746 B1 | 4/2002 | Takeuchi et al. |
| 6,426,893 B1 | 7/2002 | Conley et al. |
| 6,456,528 B1 | 9/2002 | Chen |
| 6,522,580 B2 | 2/2003 | Chen et al. |
| 6,732,221 B2 | 5/2004 | Ban |
| 6,763,424 B2 | 7/2004 | Conley |
| 6,771,536 B2 | 8/2004 | Li et al. |
| 6,781,877 B2 | 8/2004 | Cernea et al. |
| 6,850,441 B2 | 2/2005 | Mokhlesi et al. |
| 7,012,835 B2 | 3/2006 | Gonzalez et al. |
| 7,073,103 B2 | 7/2006 | Gongwer et al. |
| 7,120,729 B2 | 10/2006 | Gonzalez et al. |
| 7,158,421 B2 | 1/2007 | Li et al. |
| 7,206,230 B2 | 4/2007 | Li et al. |
| 7,243,275 B2 | 7/2007 | Gongwer et al. |
| 7,441,067 B2 | 10/2008 | Gorobets et al. |
| 7,489,549 B2 | 2/2009 | Mokhlesi |
| 7,502,255 B2 | 3/2009 | Li |
| 7,539,061 B2 | 5/2009 | Lee |
| 7,633,802 B2 | 12/2009 | Mokhlesi |
| 7,646,636 B2 | 1/2010 | Kim |
| 7,800,945 B2 | 9/2010 | Cernea |
| 7,826,271 B2 | 11/2010 | Cernea |
| 7,961,512 B2 | 6/2011 | Li et al. |
| 2002/0099904 A1 | 7/2002 | Conley |
| 2002/0184432 A1 | 12/2002 | Ban |
| 2003/0046487 A1 | 3/2003 | Swaminathan |
| 2003/0109093 A1 | 6/2003 | Harari et al. |
| 2003/0225961 A1 | 12/2003 | Chow et al. |
| 2004/0083335 A1 | 4/2004 | Gonzalez et al. |
| 2004/0177212 A1 | 9/2004 | Chang et al. |
| 2005/0073884 A1 | 4/2005 | Gonzalez et al. |
| 2005/0144365 A1 | 6/2005 | Gorobets et al. |
| 2005/0204187 A1 | 9/2005 | Lee et al. |
| 2006/0053247 A1 | 3/2006 | Cheung et al. |
| 2006/0140007 A1 | 6/2006 | Cernea et al. |
| 2006/0161724 A1 | 7/2006 | Bennett et al. |
| 2006/0161728 A1 | 7/2006 | Bennett et al. |
| 2008/0247253 A1 | 10/2008 | Nguyen et al. |
| 2008/0247254 A1 | 10/2008 | Nguyen et al. |
| 2008/0250300 A1 | 10/2008 | Mokhlesi et al. |
| 2009/0168537 A1 | 7/2009 | Kim |
| 2009/0237999 A1 | 9/2009 | Li |
| 2010/0061151 A1 | 3/2010 | Miwa et al. |
| 2010/0082884 A1 * | 4/2010 | Chen et al. ............... 711/103 |
| 2010/0091568 A1 | 4/2010 | Li et al. |
| 2010/0091573 A1 | 4/2010 | Li et al. |
| 2010/0157678 A1 | 6/2010 | Mokhlesi |
| 2010/0172179 A1 | 7/2010 | Gorobets et al. |
| 2010/0172180 A1 | 7/2010 | Paley et al. |
| 2010/0195398 A1 | 8/2010 | Sekar et al. |
| 2011/0149651 A1 | 6/2011 | Gorobets et al. |
| 2012/0124273 A1 | 5/2012 | Goss et al. |

OTHER PUBLICATIONS

Chang, "An Adaptive Striping Architecture for Flash Memory Storage Systems of Embedded Systems." Proceedings of the Eighth IEEE Real-Time and Embedded Technology and Applications Symposium, 2002, pp. 1-10.

Chiang, "Managing Flash Memory in Personal Communication Devices." IEEE, 1997, pp. 177-182.

Chiang, "Cleaning Policies in Mobile Computers using Flash Memory," Journal of Systems and Software. Elsevier Science, 1999, pp. 213-231.

Kalinsky, David, "Introduction to Priority Inversions." Embedded Systems Programming. Apr. 2002, pp. 55-56. http://www.netrino.com/Publications/Glossary/Priority/Inversion.html.

Park, "Cost-Efficient Memory Architecture Design of NAND Flash Memory Embedded Systems." Proceedings of the 21$^{st}$ International Conference on Computer Design, 2003, pp. 1-6.

Eitan et al., "NROM: A Novel Localized Trapping, 2-Bit Non-Volatile Memory Cell," IEEE Electron Device Letters, vol. 21, No. 11, Nov. 2000, pp. 543-545.

Kim et al., A 32Gb MLC NAND Memory with $V_{th}$ Margin-Expanding Schemes in 26nm CMOS, IEEE International Solid-State Circuits Conference, Feb. 2011, pp. 202-204.

Lee, et al., "Lifetime Management of Flash-Based SSDs Using Recovery-Aware Dynamic Throttling," 2012, 14 pages.

* cited by examiner

Programming into Four States Represented by a 2-bit Code

Conventional Programming with Alternating Program/Verify Sequence for a 4-state Memory

VPGM Offset Table

| Name | Operation | Cycle 1~9,999 | Cycle 10,000~14,999 | Cycle 15,000~19,999 | Cycle 20,000~29,999 | Cycle 30,000~39,999 | Cycle 40,000 and Higher |
|---|---|---|---|---|---|---|---|
| VPGM | Program | 0 | -6 DACs | -12 DACs | -18 DACs | -24 DACs | -30 DACs |
| NLP | Program | 0 | 0 | 0 | +1 | +1 | +2 |

US 8,750,045 B2

EXPERIENCE COUNT DEPENDENT PROGRAM ALGORITHM FOR FLASH MEMORY

FIELD OF THE INVENTION

This invention relates generally to non-volatile semiconductor memory such as electrically erasable programmable read-only memory (EEPROM) and flash EEPROM, and specifically to programming and erase algorithms.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM:

A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performances, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

To accurately store data, it needs to be accurately written. To increase data with greater density, memory devices are being made to store multiple bits of data per cell. There is also a trend to the scaling will make the program more noisy due to oxide interface trapping and program/erase could saturate, so that the data states are required to all be contained within a small window of threshold voltages. These two trends require that the data to be written with tighter distributions. Also, as circuits are being made on smaller scale to also increase storage densities, the smaller devices introduce or amplify phenomena that affect writing accuracy.

Therefore there is a general need for high capacity and high performance non-volatile memory. In particular, there is a need to have a high capacity nonvolatile memory with improved programming performance where the aforementioned disadvantage is minimized.

SUMMARY OF INVENTION

According to a first set of aspects, a method of operating a non-volatile memory device is presented. The memory device is formed of one or more blocks, each block having a plurality of rewritable non-volatile memory cells and where the block is the unit of erase. The method includes maintaining one or more age indications for blocks of the memory device, each of the age indications corresponding to one or more blocks. One or more memory cells from the same block are selected for a state changing operation and the state changing operation is performed on the selected memory cells. The state changing operation includes an alternating series of pulse and verify operations, wherein the voltage levels applied to the selected memory cells in the pulses depend upon the value of the age indication corresponding to the block to which the selected memory cells belong.

Other aspects relate to a non-volatile memory system having one or more memory devices. Each of memory device includes one or more arrays of one or more blocks, each block having a plurality of rewritable non-volatile memory cells, where the block is the unit of erase. Each memory device also includes program, erase, and sensing circuitry connectable to the arrays to perform a state changing operation on selected memory cells, where the state changing operation includes an alternating series of pulse and verify operations. The memory system maintains one or more age indications for blocks of the memory device, each of the age indications corresponding to one or more blocks. When performing a state changing operation on one or more selected memory cells from the same block, the voltage levels applied to the selected memory cells in the pulses depend upon the value of the age indication corresponding to the block to which the selected memory cells belong.

Other aspects of the present application present a method of providing one or more non-volatile memory circuits. The method includes manufacturing multiple non-volatile memory chips according to the same design. For each of a plurality of the memory chips, the voltage waveforms produced by the memory chip for a state changing operation on memory cells of the memory chip are individually characterized and, for each of the plurality of the memory chips, individually trimming the voltage waveforms are individually trimmed based upon the corresponding individual characterizations. Using a set of one or more, but less than all, of the manufactured memory chips, an amount of variation in device characteristics is determined for the state changing operation for a plurality of distinct age ranges. The plurality of age ranges includes a first range, that includes when the memory chips of the set are fresh, and one or more second ranges. Based on the amount of variation in device characteristics, an offset is determined for one or more values for parameters for the state changing operation for each of the one or more second ranges relative to the first range. The one or more offsets are stored on each of the plurality of non-volatile memory chips.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION OF THE PREFERRED EMBODIMENTS

Memory System

FIG. 1 to FIG. 11 illustrate example memory systems in which the various aspects of the present invention may be implemented.

Figure 1:
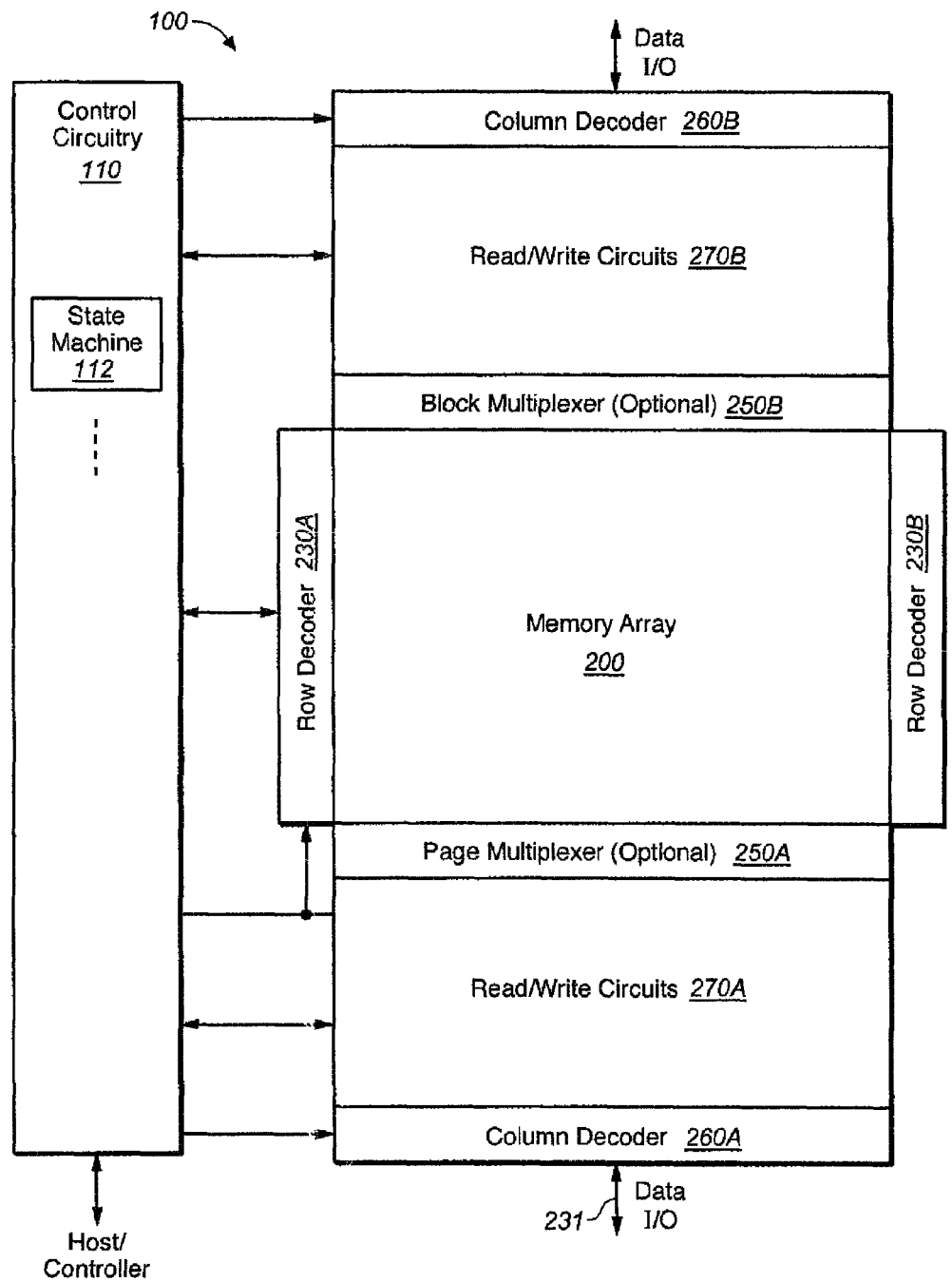
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
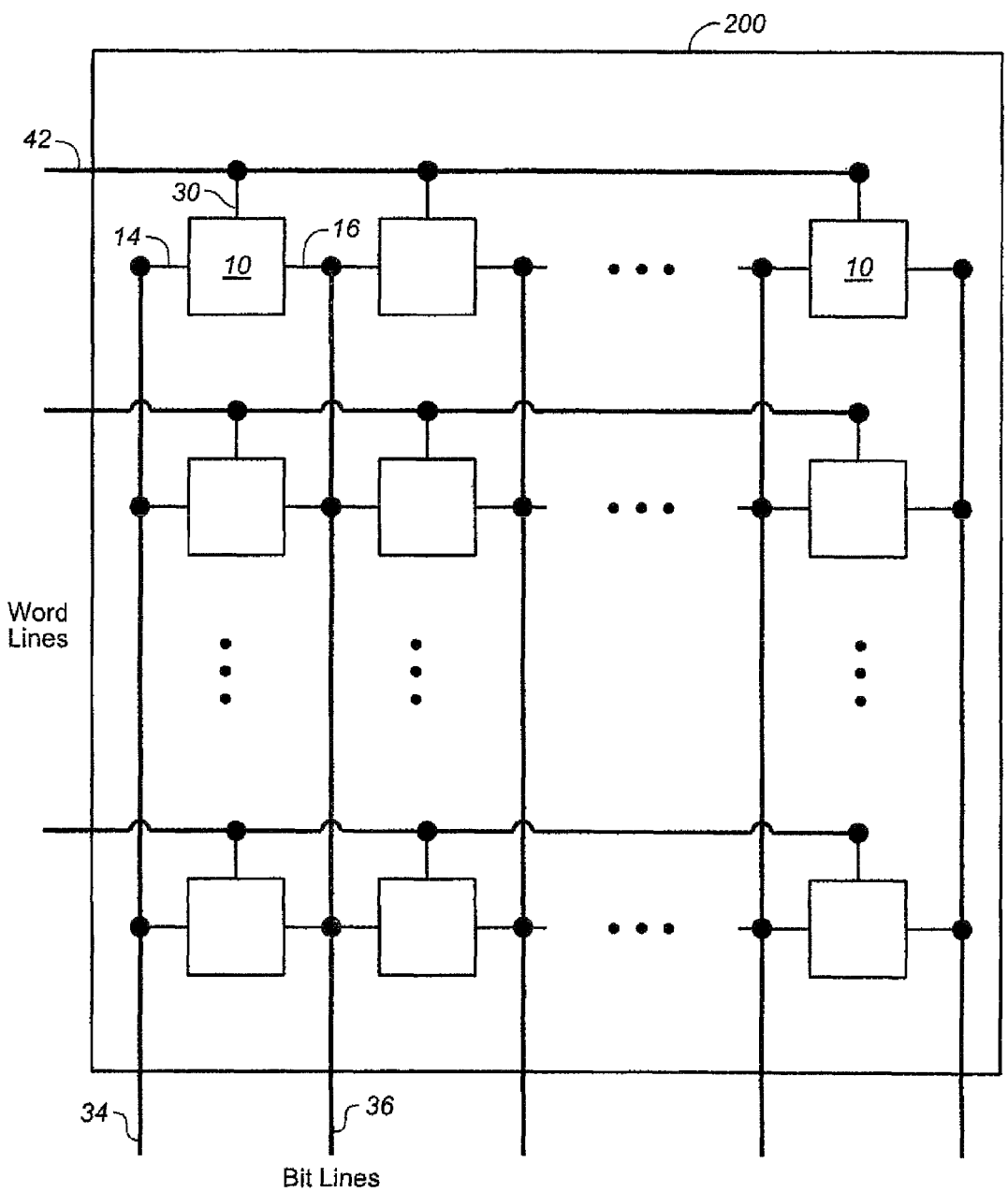
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
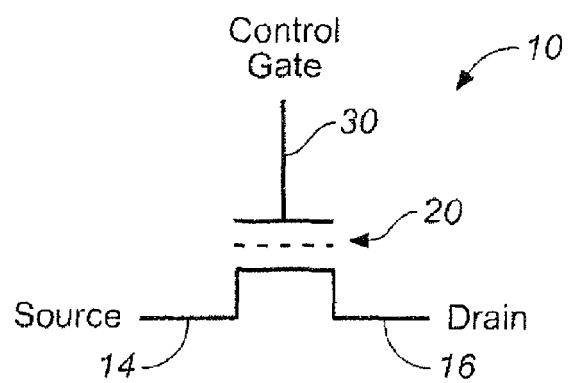
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
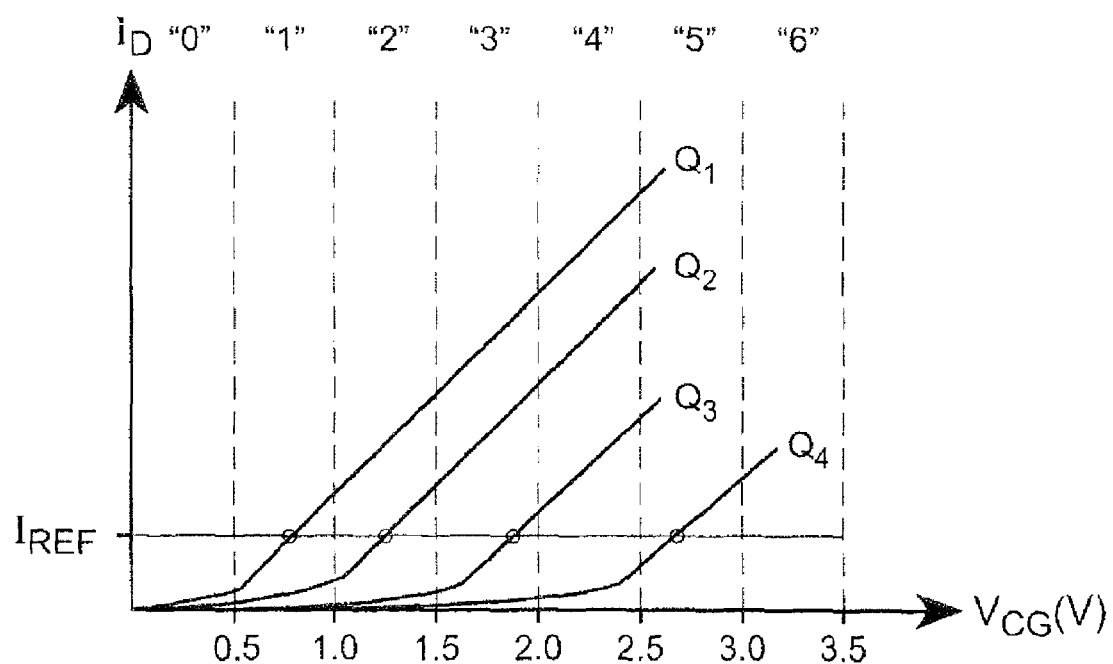
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
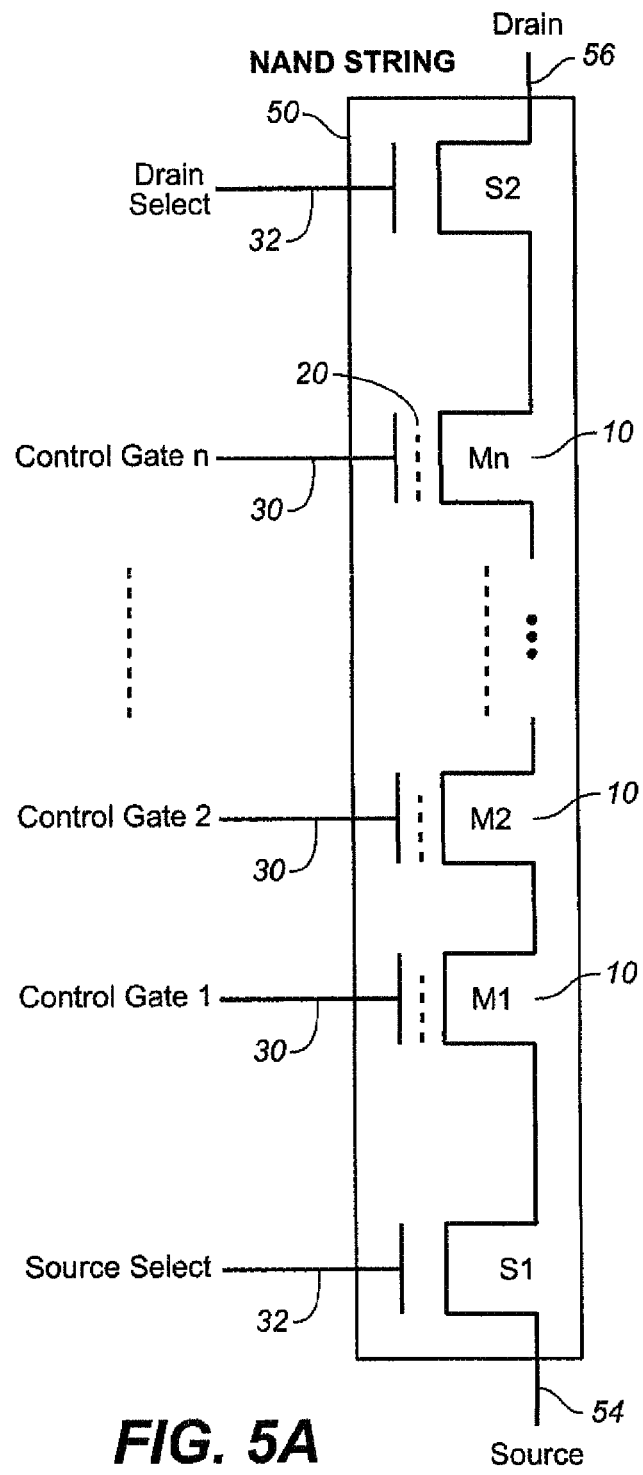
FIG. 5A illustrates schematically a string of memory cells organized into an NAND string.

FIG. 5A illustrates schematically a string of memory cells organized into an NAND string. An NAND string 50 comprises of a series of memory transistors M1, M2, ... Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
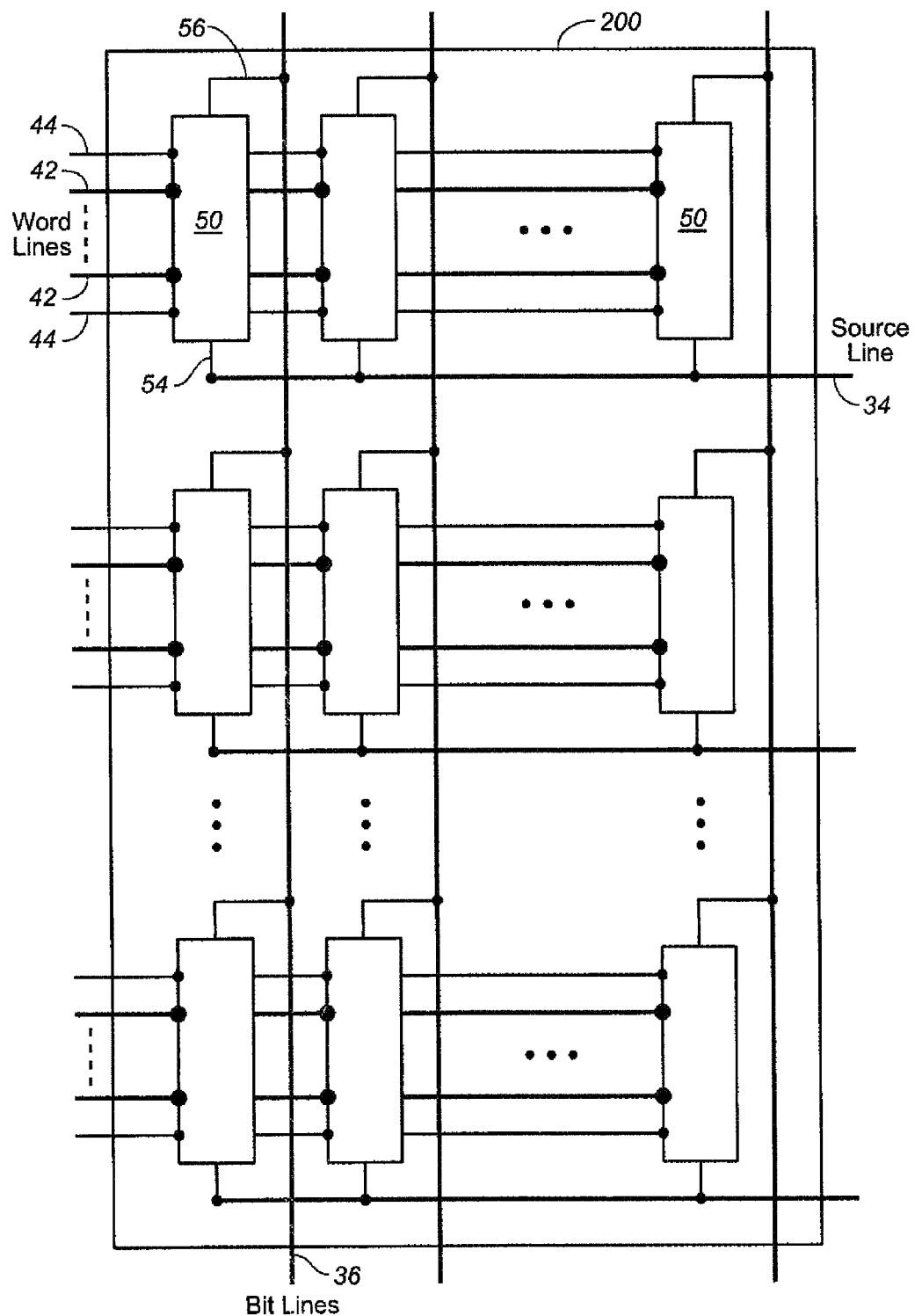
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Sensing Circuits and Techniques

Figure 6:
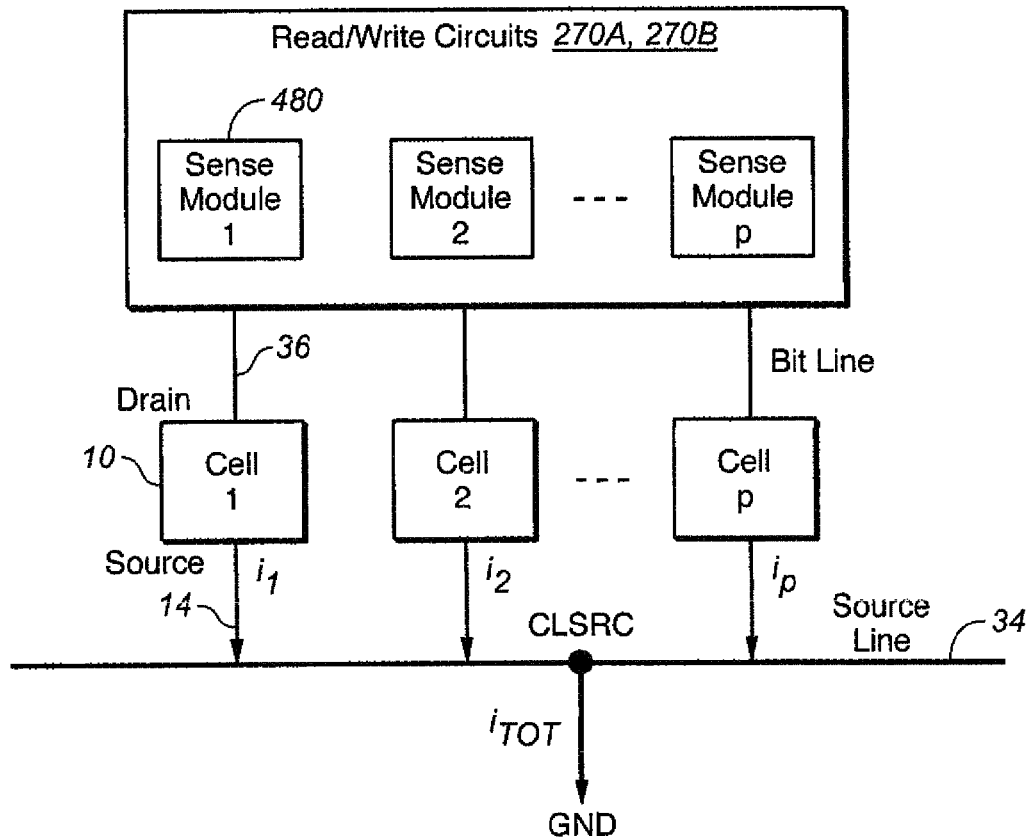
FIG. 6 illustrates the Read/Write Circuits 270A and 270B, shown in FIG. 1, containing a bank of p sense modules across an array of memory cells.

FIG. 6 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, ..., sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 7:
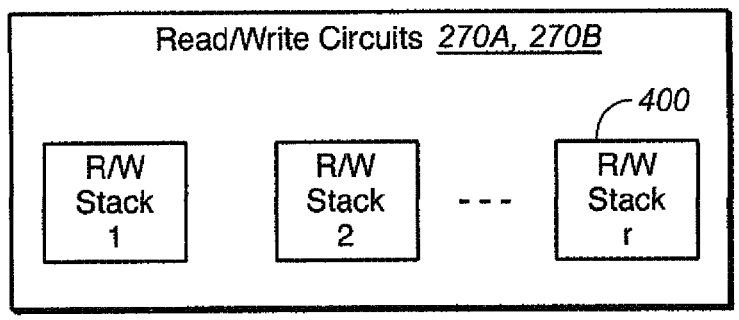
FIG. 7 illustrates schematically a preferred organization of the sense modules shown in FIG. 6.

FIG. 7 illustrates schematically a preferred organization of the sense modules shown in FIG. 6. The read/write circuits 270A and 270B containing p sense modules are grouped into a bank of read/write stacks 400.

Figure 8:
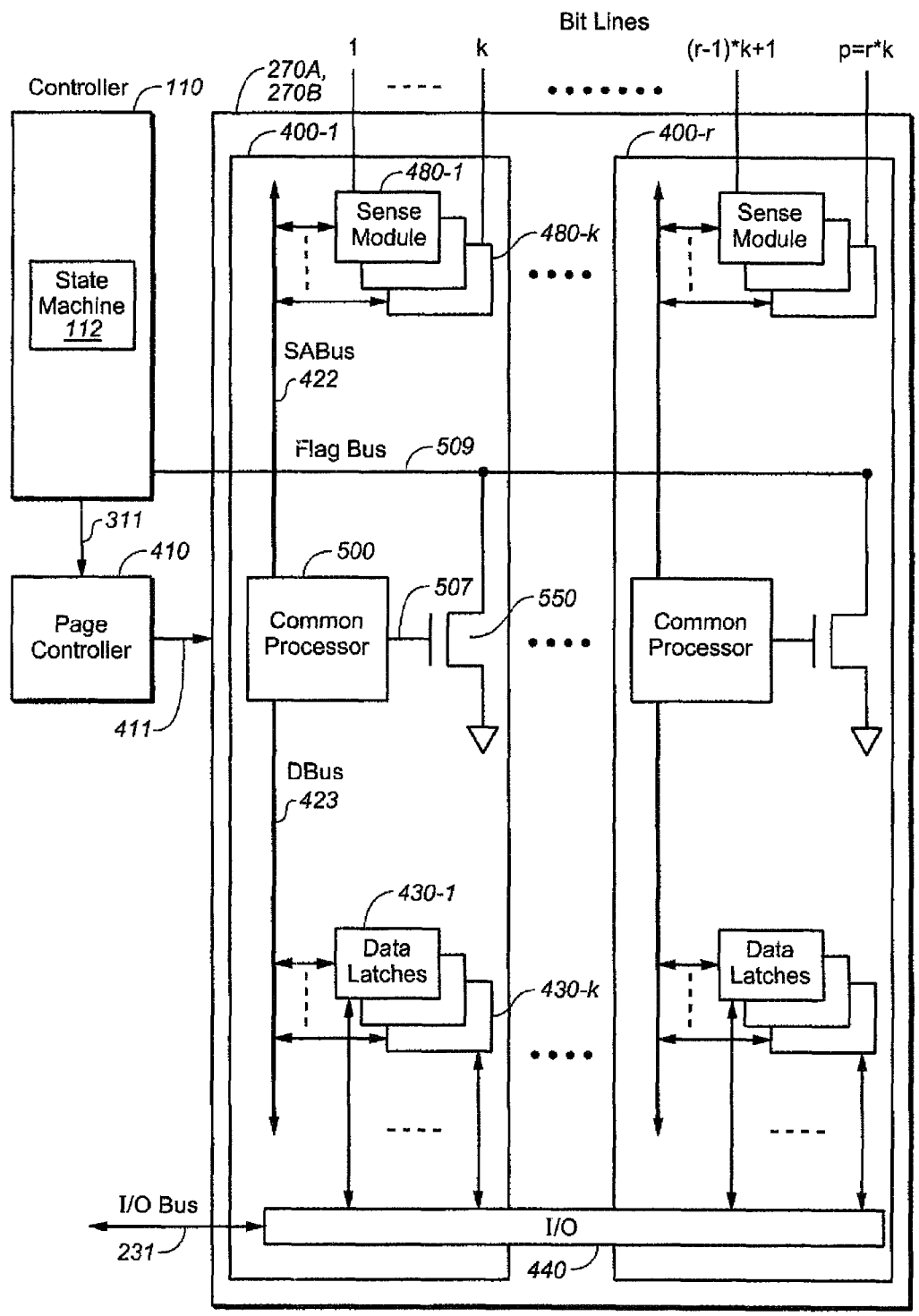
FIG. 8 illustrates in more detail the read/write stacks shown in FIG. 7.

FIG. 8 illustrates in more detail the read/write stacks shown in FIG. 7. Each read/write stack 400 operates on a group of k bit lines in parallel. If a page has p=r*k bit lines, there will be r read/write stacks, 400-1, ..., 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number: US-2006-0140007-A1 on Jun. 29, 2006, the entire disclosure of which is incorporated herein by reference.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack. The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Examples of Multi-State Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

Figure 9:
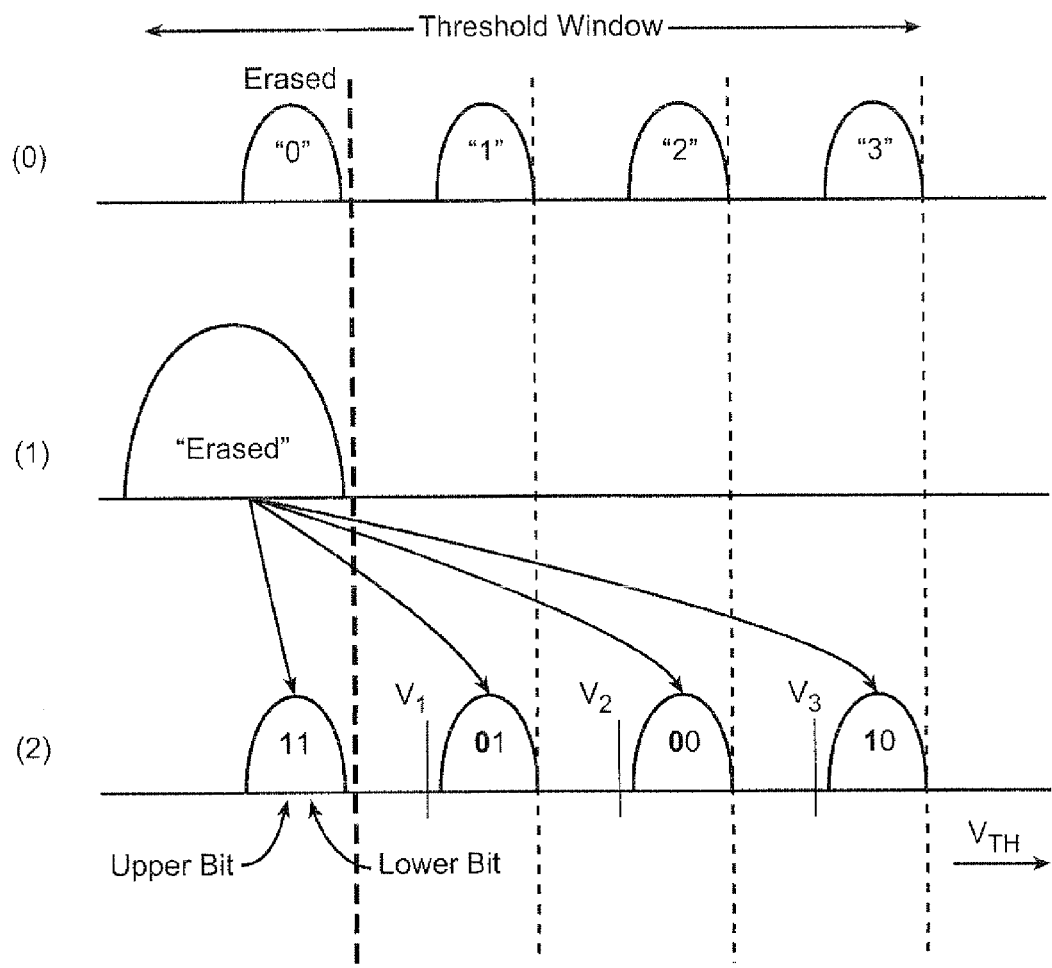
FIGS. 9(0)-9(2) illustrate an example of programming a population of 4-state memory cells.

FIGS. 9(0)-9(2) illustrate an example of programming a population of 4-state memory cells. FIG. 9(0) illustrates the population of memory cells programmable into four distinct distributions of threshold voltages respectively representing memory states "0", "1", "2" and "3". FIG. 9(1) illustrates the initial distribution of "erased" threshold voltages for an erased memory. FIG. 9(2) illustrates an example of the memory after many of the memory cells have been programmed. Essentially, a cell initially has an "erased" threshold voltage and programming will move it to a higher value into one of the three zones demarcated by $DV_1$, $DV_2$ and $DV_3$. In this way, each memory cell can be programmed to one of the three programmed state "1", "2" and "3" or remain un-programmed in the "erased" state. As the memory gets more programming, the initial distribution of the "erased" state as shown in FIG. 9(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $DV_1$, $DV_2$ and $DV_3$ in three sub-passes respectively.

Figure 10:
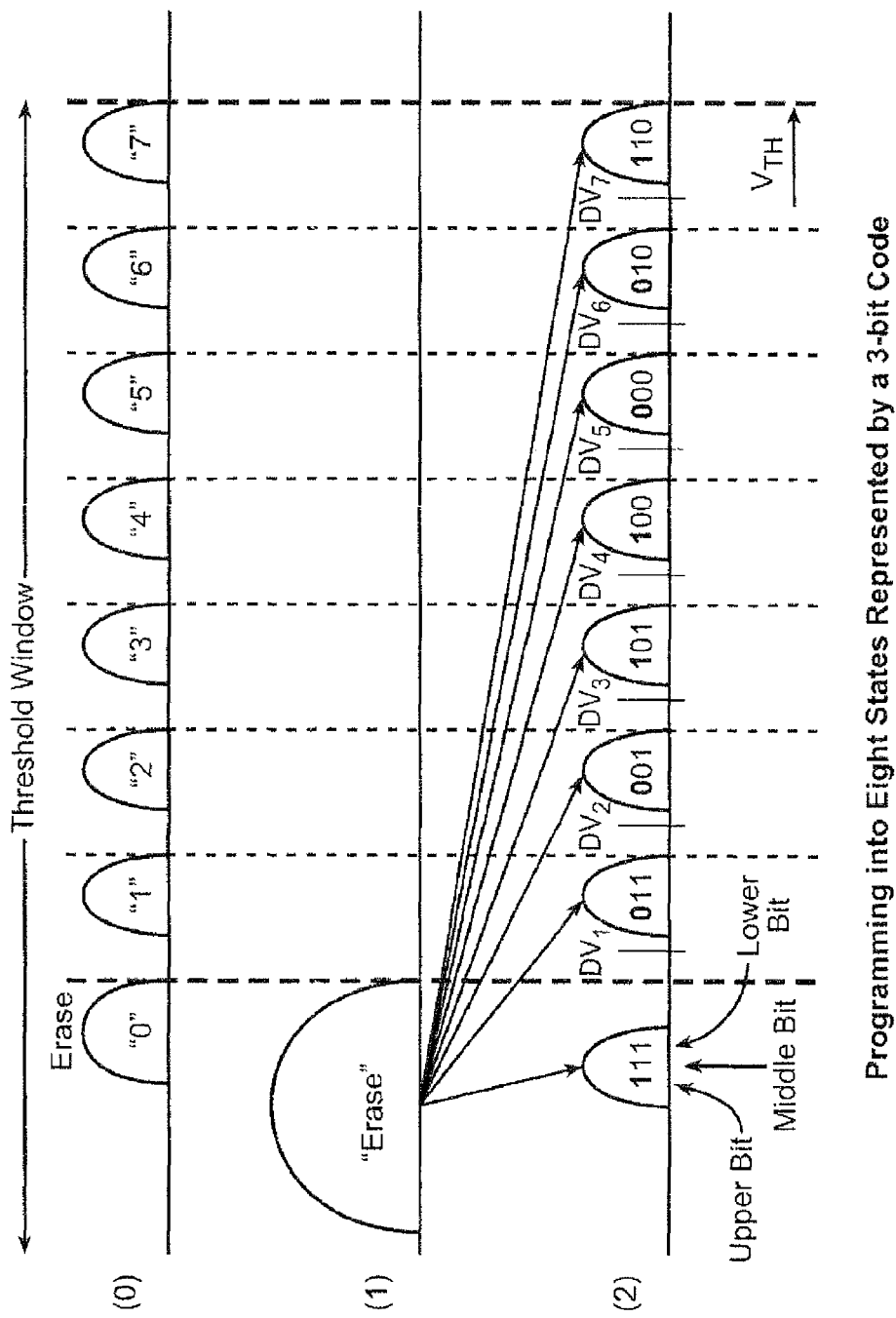
FIGS. 10(0)-10(2) illustrate an example of programming a population of 8-state memory cells.

FIGS. 10(0)-10(2) illustrate an example of programming a population of 8-state memory cells. FIG. 10(0) illustrates the population of memory cells programmable into eight distinct distributions of threshold voltages respectively representing memory states "0"-"7". FIG. 10(1) illustrates the initial distribution of "erased" threshold voltages for an erased memory. FIG. 10(2) illustrates an example of the memory after many of the memory cells have been programmed. Essentially, a cell initially has an "erased" threshold voltage and programming will move it to a higher value into one of the three zones demarcated by $DV_1$-$DV_7$. In this way, each memory cell can be programmed to one of the seven programmed state "1"-"7" or remain un-programmed in the "erased" state. As the memory gets more programming, the initial distribution of the "erased" state as shown in FIG. 10(1) will become narrower and the erased state is represented by the "0" state.

A 3-bit code having a lower bit and an upper bit can be used to represent each of the four memory states. For example, the "0", "1", "2", "3", "4", "5", "6" and "7" states are respectively represented by "111", "011", "001", "101", "100", "000", "010" and "110". The 3-bit data may be read from the memory by sensing in "full-sequence" mode where the three bits are sensed together by sensing relative to the read demarcation threshold values $DV_1$-$DV_7$ in seven sub-passes respectively.

Page or Word-Line Programming and Verify

One method of programming a page is full-sequence programming. All cells of the page are initially in an erased state. Thus, all cells of the page are programmed in parallel from the erased state towards their target states. Those memory cells with "1" state as a target state will be prohibited from further programming once their have been programmed to the "1" state while other memory cells with target states "2" or higher will be subject to further programming. Eventually, the memory cells with "2" as a target state will also be locked out from further programming. Similarly, with progressive programming pulses the cells with target states "3"-"7" are reached and locked out.

Figure 11:
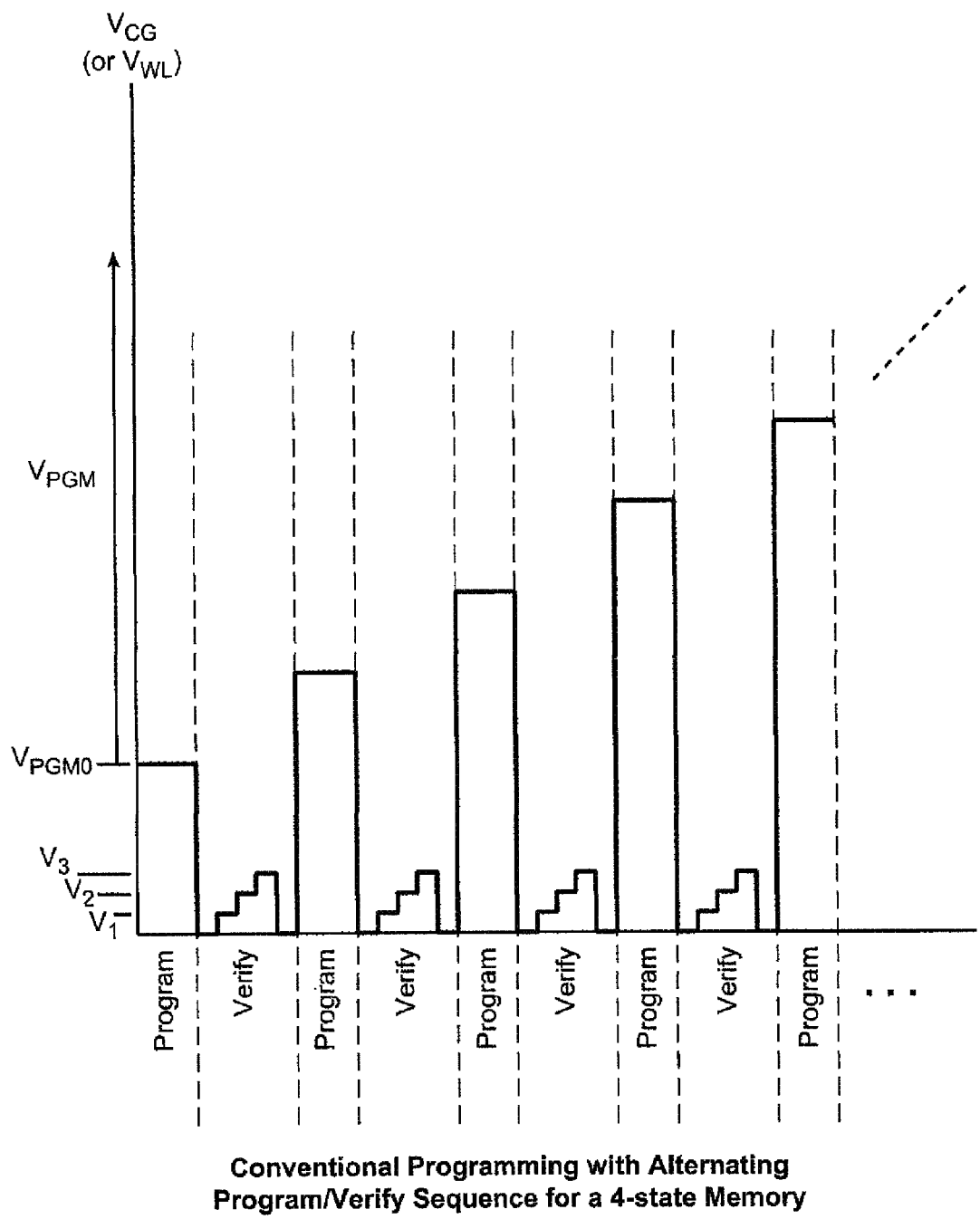
FIG. 11 illustrates a conventional technique for programming a 4-state memory cell to a target memory state.

FIG. 11 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified.

Hot Count Dependent Configural Operating Parameters

This section considers techniques for pushing flash memory endurance beyond current limits by modifying the memory's program and erase parameter based on age of the device, such as by using the hot count (number of program erase cycles) of the block. In the case of a program operation, where a page of data is being written, the age will be that of the block to which the physical page belongs. For erase operations, it will be the age of the block (or blocks) being erased.

A number of other approaches been used for extending flash memory endurance. For example, the complexity of the error correction code (ECC) used can be increased to help push the endurance limit of the device; however, this involved an increase in cost and complexity. Another approach is to employ alternate word line programming, but this also increases complexity and reduces the storage use of each block relative to the programming of all word lines (for example, twice the number of cycles can be achieved but at the cost of using only have the block at a time). The memory system could also use slower or gentler program and erase time, but this leads to lower performance. The approach described here varies the programming and erase parameters as the device ages and operational characterizes of the cells change.

Memory systems typically hold a measure of device age, typically number of program erase cycle (or hot count) of the block used, although other measures (such as the number of pulses needed to complete an erase or program operation) can be used. These hot counts (or other age values) are often kept for purposes of wear level, such as described in US publication numbers or U.S. Pat. Nos. 6,230,233: 7,441,067; or US-2010-0174845-, for example. The memory system can use this information to change default programming and erase parameters to a new value appropriate to the hot count of the block. As the block wears, the system can keep changing the parameters to make the program and erase operation more gentle on the NAND, thereby increasing the endurance of the block. This enables setting the initial program and erase parameters to be more aggressive, thereby providing higher performance, but easing these back as the device ages. This adjustment of parameters can be done either on the controller or on the memory chip side, as it reaches the maximum number of erase loops for example.

To be more concrete, the following discussion will mainly consider the programming case, where the write operation uses an alternating sequence of pulse and verify operations, such as is described above with respect FIG. 11, although the techniques can also be applied to the erase process. The process will also be discussed in the contest of a NAND memory system having both binary (or SLC) and multi-state (or MLC) sections, such as is described in U.S. Pat. No. 8,144,512 or U.S. patent application Ser. No. 13/556,035 or references cited in these, for example. In such mixed SLC-MLC arrangements, it is often the binary section that suffers the most from wear due it use in a binary cache type of function. Consequently, although the sort of configurable parameter arrangement described here can be used on both binary and MLC portions, the discussion focuses on the binary storage cells in the SLC section. Also, in the following, age and hot count will be used largely interchangeable, although other measures of device age can be used, and age will be on a block by block basis, although other granularities (i.e., multi-block or die ages) can be used.

For flash memory blocks, as cycling increases, the physical properties of the memory cells can change, often become faster to program. This can lead to severe over programming may occur for heavily cycled blocks, such as binary cache blocks, and lead to uncorrectable ECC read failure. This over programming typically shows up as a trend of erase state shifting to the lowest program state. This sort of over programming failure can be reduced by using lower start Vpgm value for the staircase waveform; however, with a lower start Vpgm, it takes more programming-verify interactions to complete a page write, and consequently this has impact on performance.

This situation can be improved upon by keeping the default start Vpgm for fresh unit and keep using this parameter value up to a reasonable cycle count, in order to maintain the target performance level, as long as over programming is not an issue for such an endurance range. When the device becomes more heavily cycled, the system can dynamically change the start Vpgm value to a lower value to avoid over programming. The amount of shift for starting Vpgm waveform, and the amount cycling at which the shift should is made, can be determined as part of the device characterization process. For example, for 0 cycle to 10K cycle, there may need to be no change Vpgm; while from 10K and up, the start Vpgm is to be shift down. Alternately, this could be arranged to shift up the start Vpgm for faster programming times for fresh units, given that when in a fresh state over programming effect is usually less of a concern, so that the device can be programmed faster by a higher start Vpgm value. For either variation, endurance can be improved.

The start Vpgm value and other related NAND parameters are mostly die specific. These values can be stored in ROM registers, from which the system can read out the default values during the device manufacturer and test time for each die. The system can then write these parameters into RAM or to flash. Depending on the embodiment and physical properties of the device, the change to the value can be a positive or negative delta to the value stored in the ROM-fuse registers.

When to update the shift to Vpgm can be based on the hot count per block or metablock. In an exemplary embodiment, the system can have up to a maximum of 10 hot count ranges, covering 0 to 100K for the hot count values. A specific delta value can be assigned to each hot count range. Alternate embodiments can the average hot count of the system or the worst case hot count of the system. Here, the hot count of each block is used since there can be very different usages of blocks: for the example of SLC blocks in a combined SLC-MLC system, the SLC blocks such as control blocks, binary cache, SLC update blocks, enhanced SLC user area, and so on, and some of these may have very different hot count than the others; and if a relatively fresh block uses a set of parameters which are for a higher hot count range, there is SLC performance impact.

As to when to update the Vpgm values, when the system wants to do a write operation (whether this is a control structure update or host data write), the system can read out the hot count information corresponding to the appropriate block, and compare it against the current hot count range of the die. If the block's hot count is within the current hot count range, the system need not update the Vpgm parameters of the memory device, which can continue to perform the write operation to such block. If the block's hot count is outside of the current hot count range, then the device parameters are updated before any write operation to the block. The system's firmware can retrieve the initial NAND parameters from the RAM, and add/subtract the offset values specified for hot count range to which the block belongs.

Concerning the conditions when the Vpgm parameters are reset and reload is needed, when there is power down to NAND device, a parameter reset, or a hard reset is triggered, the romfuse registers from the device will be reset to default.

Before the next program operation to SLC block, the system is responsible to look at the hot count of the block and reload the initial values as needed.

In the exemplary embodiment, the maximum size of the matrix for storing the offset values is 10×10: 10 parameters, 10 hot count ranges. 10 more bytes are used for storing addresses. In the parameter files, there can be parameters to determine how many parameters to change, and how many hot count ranges to set. The exemplary embodiment, the offset table is stored in RAM on the controller for performance reason; if not, for every hot count range change, there will be a control read of the file with these parameters.

As noted, the values for the parameters can be calculated as part of the device characterization process by on one or, preferable, a number of devices. The offset values can be taken as the same for all the devices of the same time. The values can be saved on all of the devices or, since it is the same for all of the devices, just once for all of the memory chips in a multi-chip arrangement. For example, in a memory card or solid state drive (SSD) device, the parameters could only be saved on the controller or a single chip, but it may be more practical for each memory chip to store the value. In any case, when these parameters are downloaded, the firmware can load the initial values from the NAND device. In the system file, the offset values can be provided in 2's compliment format. As some of the NAND parameters may not take up to a full 1 byte, it can share the same byte with other parameters. The system can look up the bit assignment (which can also be listed in same system file) for the particular parameter to change and mask out the rest of the bits from that byte before the addition or subtraction. There file can also specify underflow and overflow limits, as the system should preferably make sure that it does not run into underflow or overflow situations. In this process, the system should not touch or change any values for the rest of the parameters not being specified for this Vpgm feature during parameter update.

Although the exemplary embodiment uses the same hot count dependent program value shifts for all of the devices of a given type, the individual devices themselves will typically be individually trimmed at test time to have the desired, unshifted fresh values. This is due to device to device variations in the manufacturing process so that, for example, chips on different areas of a wafer come out somewhat differently. Consequently, each device will individually have a digital set to provide the proper fresh (analog) voltage values. The common hot count dependent parameter shifts can then also be stored as a digital value to be used by all of the memory chips based upon a selected blocks hot count.

Figure 12:
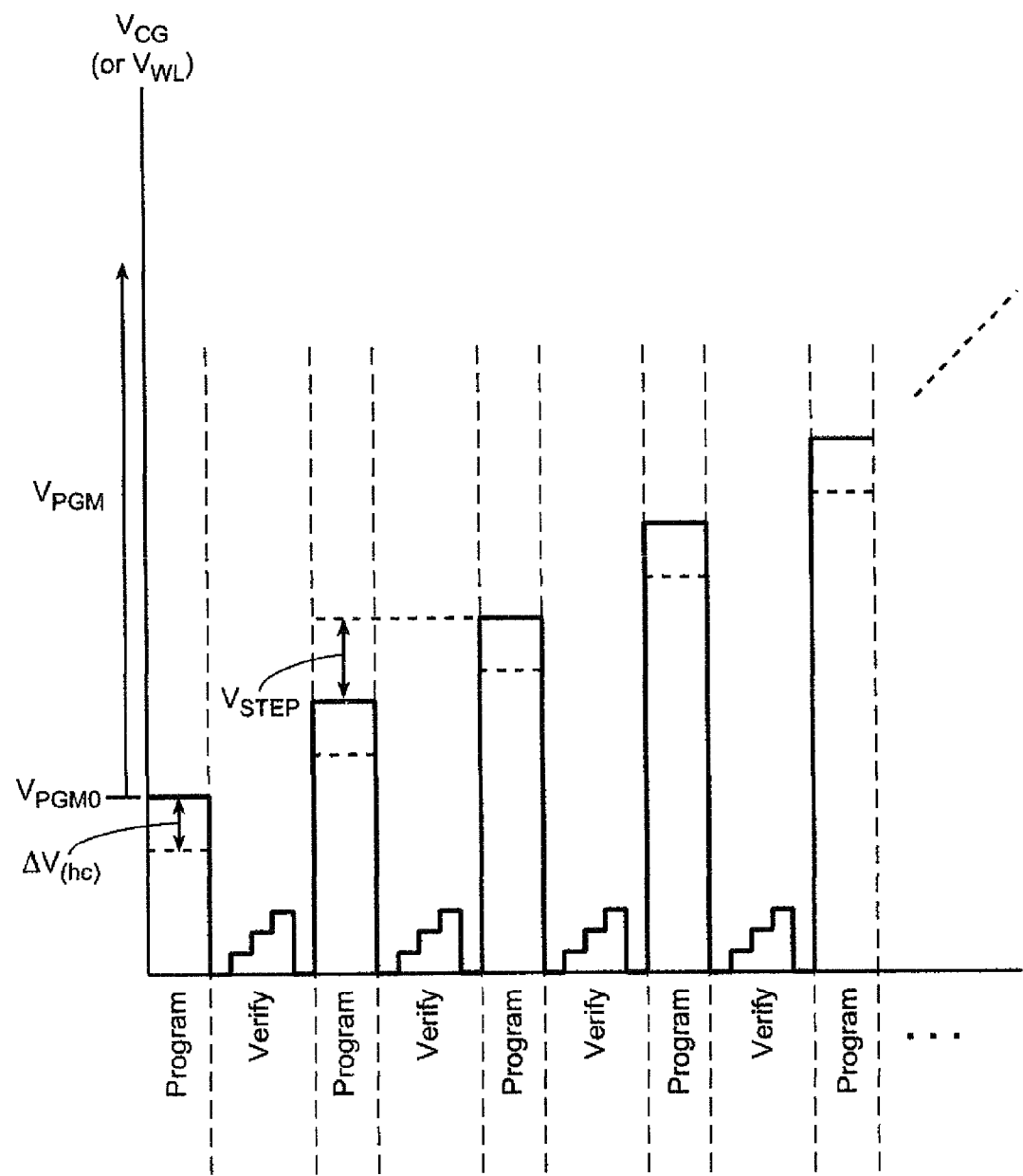
FIG. 12 is an exemplary programming waveform, as in FIG. 11, but illustrating a hot count dependent shift

FIG. 12 illustrates an exemplary embodiment of the sort of hot count dependent parameter shift described here. FIG. 12 is based on the more conventional waveform of FIG. 11, but with the verify voltage levels not indicated on the voltage axis. The programming waveform $V_{PGM}$ is an increasing staircase of pulse, where the steep size is $V_{step}$. When fresh, the staircase begins at $V_{PGM0}$. After a certain hot count value, $V_{PGM0}$ is shifted down by an amount $\Delta V(hc)$ to the level indicated at the dotted line (here the shift is downward, as is often the more typical case for flash NAND devices). As the step size is kept the same in this example, all of the steps are lowered by the same amount. (Other embodiments may use a non-uniform step size.) Although the exact amounts will vary for different devices, the shift $\Delta V(hc)$ is typically of same sort of amplitude as the step size.

In the example of FIG. 12 it is the initial $V_{PGM0}$ value that is shifted, but other parameter can be changed additionally or instead, such as step size, pulse duration, and so on. In particular, when $V_{PGM0}$ is shifted downward by $\Delta V(hc)$, it may also be needed to change the maximum number of allowed pulses, $n_{MAX}$, to ensure non-defective cells can be programmed. And although shown here for a write process, a similar set of shifts can also be applied to erase operations. For example, erase operations are typically based on a pulse-verify arrangement (see US-2005-0265081-A1 or U.S. Pat. No. 6,839,281, for example), but with the pulse now being applied to pull electrons back to the substrate, rather than being applied to the word line to place electrons onto the floating gate.

As noted above, at download time, the system firmware can read all initial $V_{PGM}$ shift parameters from the register addresses listed in the appropriate file from a controller back-end configuration section, and store the initial values into corresponding device system file. Then afterwards, for every power on initialization, the firmware can read the system file to retrieve the initial parameter values and store them in controller RAM. In an exemplary embodiment, the RAM usage would be to store: Address of parameters; Initial value of parameters for all dies; Current value used for all dies; and Current hot count range for all dies. In the exemplary embodiment of a combined SLC/MLC memory system where only the binary SLC section uses this technique, only the binary hot counts are needed for this purpose. Some or all of this information can also be backed up in the non-volatile memory.

Figures 13, 14:
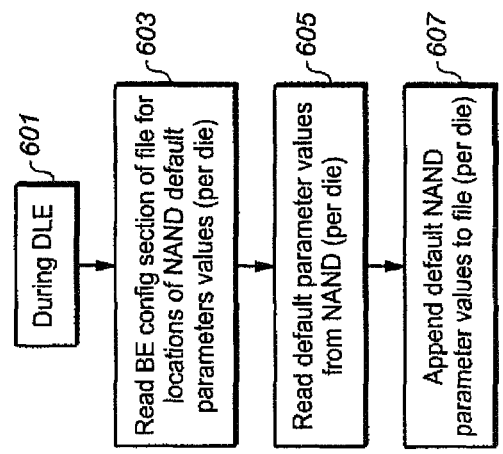
FIG. 13 is an example of a table of programming parameter shifts for various hot count ranges.
FIG. 14 is a flow chart for a process of down loading programming parameter shifts.

FIG. 13 is an example of a table in which the hot count dependent parameters can be kept in a system file. The table includes the parameter name, the operation involved, and the parameter values for different hot count ranges. The first parameter is the off-set value, $\Delta V(hc)$ in FIG. 12, and the second parameter is the change in the maximum number of allowed pulses. The second column indicates that both of these parameters relate to the program process. When fresh, the pulses have no offset, but for each increasing range of erase-program cycles (here in 10K increments), the values are increasingly lowered. Here, the values are shown as digital values which are converted to analog voltage offsets on the device. For very high hot counts where this shift becomes relatively large, the maximum number of allowed pulses is increased first by 1 and eventually by two pulses.

FIG. 14 is a flow chart of the download (DLE) process for the parameters, starting at 601, with the process preferably being at post-manufacturing test time. At 603, the back end (BE) configuration section of the appropriate file is read for locations of the NAND default parameters are read, preferable on a per die basis. At 605, the default parameter values are read from the memory chip, again preferably on a per die basis. At 607, the default parameter values are appended to the corresponding file, again on a per die basis. Again, this process is performed before the device is used by the end consumer, typically as by the manufacturer as part of the post-manufacturing test process, but could also be done by an intermediate supplier at the same time other parameters are downloaded. In any case, this is done before shipping in order to set the default values.

Figure 15:
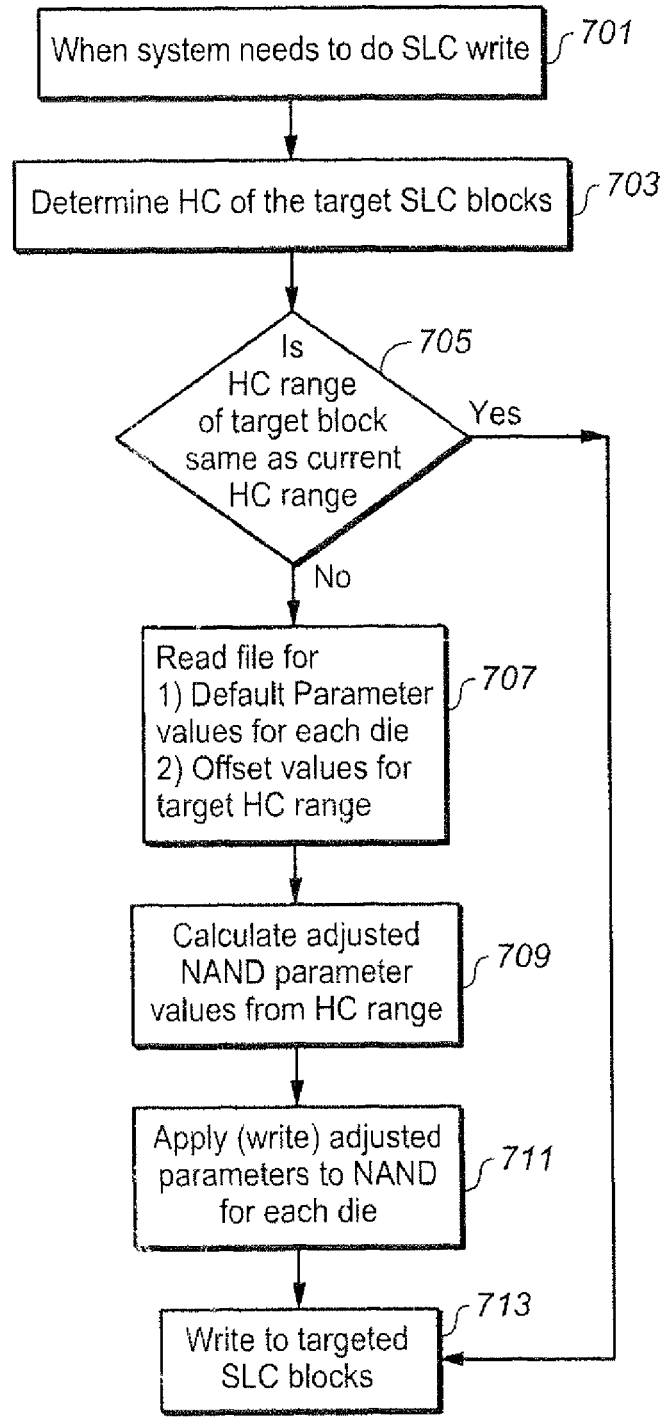
FIG. 15 is a flow chart for determining programming parameter for a write process in an exemplary embodiment.

FIG. 15 is a flow chart of how these parameters are then used, starting from before a write process to the binary section of a combined SLC/MLC NAND memory, where the parameter offsets are applied to the binary, but not multi-state section. At 701, the system determines a write to an SLC block, such as binary cache, a system block and so on. At 703, the hot count of the target block or blocks are determined. At 705 the system determined whether hot count is still in the same range as at the time of the previous write; if so, the write to the targeted block is executed using the same parameters as before at 713; if not, then the flow goes to 707 in order adjust the parameters.

At 707, the file is read for the default parameter values and the offset values for the target age range. The adjustment to the device parameter values is calculated at 709 based on the hot count at 709, where the calculation is checked of any underflow or overflow. The adjusted parameters are then applied at 711, after which write operation is performed at 713.

As it can be very useful to log device failures, the memory device can include a capability to flush the $V_{PGM}$ value that is stored in RAM to file system file, such as an error log, upon occurrence of a program failure, erase failure or uncorrectable ECC error. This information can then be used for failure analysis, since, if there were no such logging, after a power cycle the parameter values are usually reset to default, so that it could not be determined whether any failure is due to inaccurate NAND parameters or other causes.

Considering the effects of this section's techniques on device performance, when a device is relatively fresh, there is no change specified on the program or erase parameters for the particular hot count range, so that there should be no performance degradation. Similarly, where the remains in the same hot count range for the newly selected block (corresponding to the "Yes" path out of 705 in FIG. 15), the system should not suffer any performance degradation. The additional logic of comparing the hot count of a selected block with the current hot count range of the die should have minimum or no impact to performance. Somewhat more performance impact can be expected when the system selects a block where the hot count is out of the current range and therefore needs to update NAND parameters; however, the time it needs for each parameter to update can be kept quite small, in the μS range for example.

CONCLUSION

Although the various aspects of the present invention have been described with respect to certain embodiments, it is understood that the invention is entitled to protection within the full scope of the appended claims.

The invention claimed is:

1. A method of providing one or more non-volatile memory circuits, comprising:
   manufacturing multiple non-volatile memory chips according to the same design;
   for each of a plurality of the memory chips, individually characterizing the voltage waveforms produced by the memory chip for a state changing operation on memory cells of the memory chip;
   for each of the plurality of the memory chips, individually trimming the voltage waveforms based upon the corresponding individual characterizations;
   using a set of one or more, but less than all, of the manufactured memory chips, determining an amount of variation in device characteristics for said state changing operation for a plurality of distinct age ranges, the plurality of age ranges including a first range, that includes when the memory chips of the set are fresh, and one or more second ranges;
   based on the amount of variation in device characteristics, determining an offset for one or more values for parameters for the state changing operation for each of the one or more second ranges relative to the first range; and
   storing the one or more offsets on each of the plurality of non-volatile memory chips.

2. The method of claim 1, wherein the state changing operation is an erase operation.

3. The method of claim 1, wherein the state changing operation is a program operation.

4. The method of claim 1, wherein the voltage waveforms includes a series of pulses forming a staircase of increasing amplitude.

5. The method of claim 4, wherein the staircase has uniform step size and the trimming includes setting the amplitude of the initial pulse of the staircase.

6. The method of claim 4, wherein the offsets include an offset for the amplitude of the initial pulse of the staircase.

7. The method of claim 6, wherein the offsets include a shift in the maximum number of allowed pulses for the staircase.

8. The method of claim 1, further comprising:
   subsequently forming one or more of said plurality of non-volatile memory chips and a controller chip into a non-volatile memory system.

9. The method of claim 8, where the non-volatile memory system is a memory card.

10. The method of claim 8, where the non-volatile memory system is a solid state drive.

* * * * *